HIGH POWER AUDIO AMPLIFIER EMPLOYING TRANSISTORS

Filed May 7, 1956

INVENTOR
ALEXANDER B. BERESKIN

BY W. H. Breunig
AGENT 2,932,800
Patented Apr. 12, 1960

2,932,800

HIGH POWER AUDIO AMPLIFIER EMPLOYING TRANSISTORS

Alexander B. Bereskin, Cincinnati, Ohio, assignor to The Baldwin Piano Company, Cincinnati, Ohio, a corporation of Ohio Application May 7, 1956, Serial No. 583,184
13 Claims. (Cl. 330—14)

Figure 1:
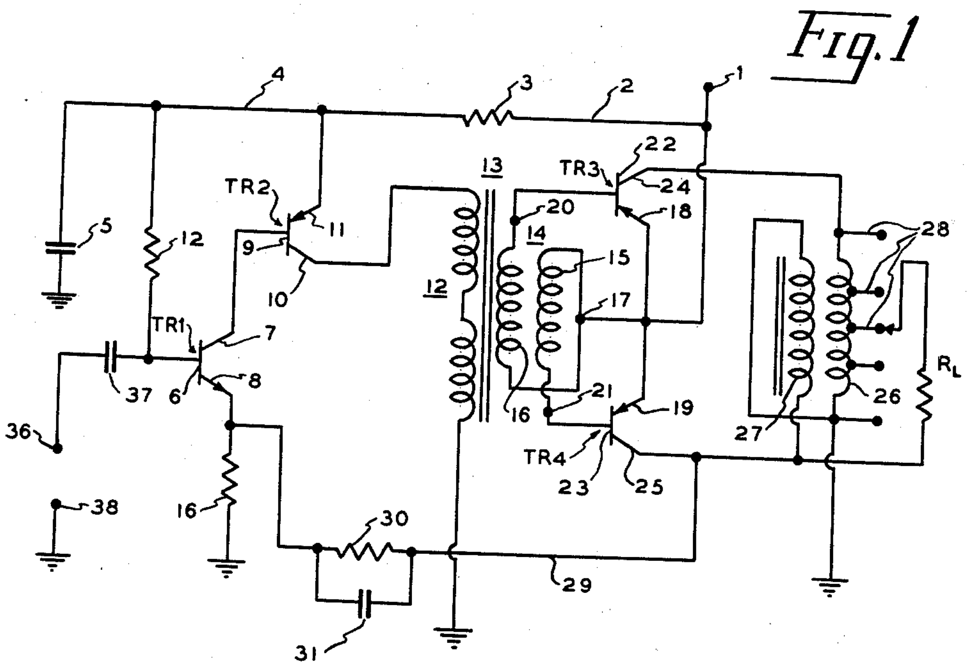

The present invention relates generally to amplifiers, and more particularly to high power audio transistor amplifiers.

Briefly describing a specific embodiment of the present invention, three stages of audio amplification are included, including pre-amplifier and driver stages, both operated class A and a push-pull output stage, operated class B. The output and driver stage employ transistors of similar conductivity type while the pre-amplifier employs a transistor of opposite conductivity type, and more particularly the driver and output stages may employ PNP transistors while the pre-amplifier stage employs an NPN transistor. The transistors are all connected in the common emitter configuration, to insure maximum gain per stage regardless of distortion.

The collector electrode of the NPN pre-amplifier is direct coupled to the base of the PNP driver stage. The output stage is transformer coupled to the driver stage, and auto-transformer coupled to the output load. Use of an NPN pre-amplifier direct coupled to a PNP driver, with a PNP output stage, makes available a feed-back terminal at the emitter terminal of the pre-amplifier which is at essentially the same D.-C. potential as a collector of the output stage, and which is degeneratively driven when directly connected to that collector, permitting direct coupled audio feed-back from the load to the input circuit of the amplifier.

The secondary winding of the driver transformer is composed of two bi-filarly wound halves, a feature which contributes greatly to elimination of class B conduction transfer notch. The output transformer is an auto-transformer, having bi-filarly wound halves, which further contributes greatly to elimination of class B conduction transfer notch. Close coupling between primary and secondary windings of the driver transformer and between the winding halves of the output auto-transformer, and elimination of an output transformer secondary winding, maintains the phase shift in the feed-back loop at a minimum over the useful frequency range.

The feed-back loop includes a D.-C. connection having therein a parallel connected resistance and capacity, extending between one output stage transistor collector electrode and the emitter of the pre-amplifier stage. The transistor collector electrode from which feed-back is taken is the one which produces over-all degenerative feed-back. The feed-back loop capacitor controls the distortion and the low level frequency response characteristics at high frequencies.

It is, accordingly, a primary object of the present invention to provide a transistor amplifier capable of providing high audio output power, over the audio frequency range, with a minimum of distortion.

It is a further object of the present invention to provide a system of audio amplification which employs a transistor pre-amplifier stage employing an NPN transistor to drive a PNP direct coupled driver stage for a class B PNP push-pull power output stage, wherein the input circuit of the output stage is a transformer having bi-filarly wound secondary winding halves, and the output circuit of the output stage is an auto-transformer having bi-filarly wound winding halves.

It is another feature of the invention to provide a novel system of class B amplification employing transistors as amplifying elements, wherein an auto-transformer impedance matching output stage is employed, to permit direct coupling of one side of a load to a transistor terminal.

It is a further feature of the present invention to provide a class B push-pull transistorized power output stage in an audio frequency amplifier, wherein a bi-filarly wound output auto-transformer is employed to reduce class B conduction transfer notch.

It is still a further feature of this invention to provide a class B push-pull transistorized power output stage in an audio frequency amplifier, wherein an input transformer is employed having bi-filarly wound secondary winding halves, to reduce class B undesired conduction transfer phenomena.

A further object of the present invention resides in the provision of a high power transistorized audio amplifier system employing a pre-amplifier stage, a driver stage and a push-pull output stage, having provision for a direct coupled negative feed-back loop between the load and the pre-amplifier stage.

It is a further object of the present invention to provide a system of audio amplification employing a transistorized pre-amplifier, driver and class B output stage, in cascade, wherein is employed a transistor circuit in the pre-amplifier stage which operates with emitter current of one polarity, and transistor circuits in the remaining stages which operate with emitter current of opposite polarity, to enable establishment of a D.-C. feed-back loop from the amplifier output to the pre-amplifier stage.

Figure 2:
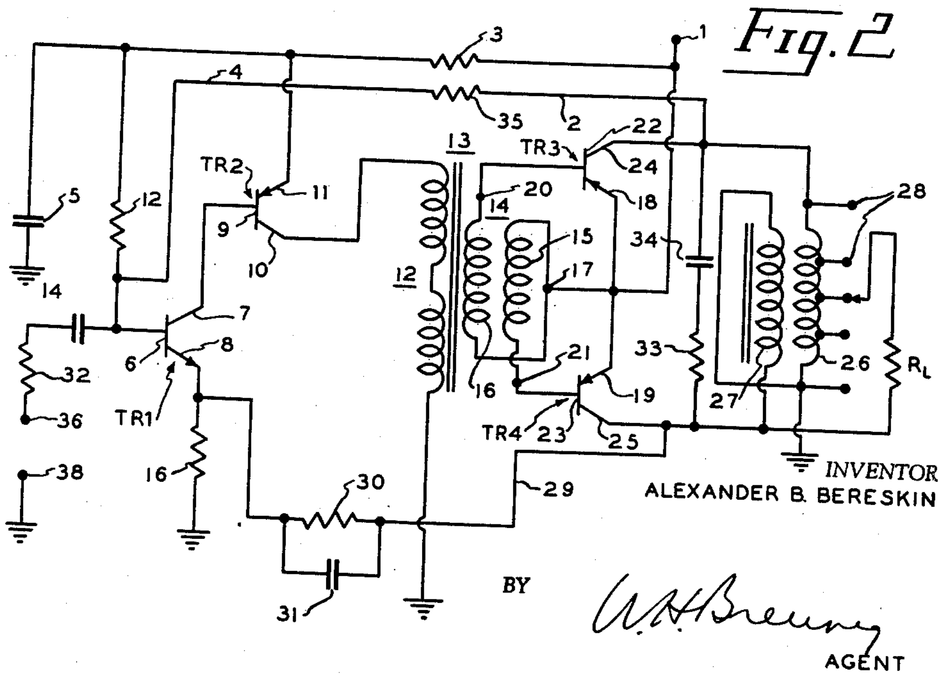

The above and still further objects, features and advantages of the present invention will become apparent upon consideration of the following detailed description of one specific embodiment thereof, especially when taken in conjunction with the accompanying drawings, wherein:

Figure 1 is a schematic circuit diagram of of a system in accordance with the invention, and Figure 2 is a schematic circuit diagram of a modification of the system of Figure 1.

Referring now more particularly to the accompanying drawings, the reference numeral 1 denotes a terminal for supplying a positive D.-C. voltage (28 v.), which may be derived from any suitable power source. The terminal 1 is connected by a lead 2, and through a voltage dropping resistor 3 and a lead 4, to a large filter condenser 5, one terminal of which is grounded. A pre-amplifier is provided, which employs a transistor TR1, of the NPN type, operating in the common emitter configuration. A driver stage is further provided, which employs a transistor TR2 of the PNP type, operating in the common emitter configuration. The transistor TR1 includes a base electrode 6, a collector electrode 7 and an emitter electrode 8. The transistor TR2 includes a base electrode 9, a collector electrode 10 and an emitter electrode 11.

The base 6 of transistor TR1 is connected to lead 4 via a relatively large voltage dropping resistance 12, and is capacitively coupled to an input terminal 36, by means of a coupling condenser 37. A further input terminal 38 is grounded. The emitter electrode 8 is connected to ground via a small resistance 16, which is thus effectively in the input circuit of transistor TR1. The collector electrode 7 of transistor TR1 is directly connected to the base of transistor TR2. The emitter electrode 11 of the transistor TR2 is connected directly to lead 4, and the collector electrode 10 in series with a primary winding 12 of an audio driver transformer 13.

In the NPN transistor circuit the base is required to be positive with respect to the emitter, while in the PNP transistor circuit the opposite is true. In the present circuit the emitter 8 is operated at near ground potential, except for the interposition of the resistance 16, which serves to permit introduction of feed-back signal. The base 6 is operated at a positive voltage greater than that at emitter 8, by its connection through voltage dropping resistance 12 to the positive lead 4. The collector 10 of transistor TR2 is at D.-C. ground, essentially, while its emitter electrode is directly connected to lead 4, and therefore is at high D.-C. level (+18 v.). The base current of transistor TR2 constitutes the collector current of transistor TR1, so that amplified collector output current of NPN transistor TR1 flows through the base-emitter circuit of the PNP transistor TR2, and constitutes the signal input to the latter. Interstage coupling elements are not needed because of the direct connection, and the same single voltage supply biases all the electrodes of both transistors.

The secondary winding 14 of an interstage transformer 13 includes two winding halves, 15 and 16, which are bi-filarly wound. The mid-point 17 of the winding halves 15 and 16 is connected to the emitters 18 and 19 of push-pull connected transistors TR3 and TR4, and to the lead 2. Accordingly, the emitters 18 and 19 are maintained fixed at +28 v. The remaining end terminals 20, 21 are connected, respectively, to the base 22 of transistor TR3 and to the base 23 of transistor TR4. The base electrodes 22, 23 are therefore at the same D.-C. voltage as the emitters. However, the driving currents applied to the base electrodes 22, 23 are of opposite phase, since the transformer terminals 20, 21 are at opposite ends of the transformer windings. The use of bifilarly related secondary windings in transformer 13 reduces leakage reactance between the secondary halves 15, 16 to insignificant value and therefore radically reduces the conduction transfer notch which would otherwise occur. The conduction transfer notch phenomenon, which is known to generate distortion in the output circuits of class B vacuum tube amplifiers, is also found to be present in both input and output circuits of transistor amplifiers. Elimination of conduction transfer notch distortion in transistor amplifier has been attempted, heretofore, by introducing base bias into the circuit, and by connecting diodes between bases and emitters to by-pass reverse signal-induced bias. It is found that these expedients are not required, if bi-filarly related input windings are employed.

The collector electrodes 24, 25 of the transistors, TR3, and TR4 are connected, one, 24, in series with an output winding 26 to ground, and the other, 25, in series with winding 27 to ground. The windings 26 and 27 are bi-filarly related, the grounded end of winding 27, being adjacent the ungrounded end of winding 26. A load $R_L$, which may be a loudspeaker, horn driver, recording head or the like, is connected across the winding 26, 27 in series, or, by providing taps 28 across a pre-selected portion thereof. The windings 26, 27 constitute an auto-transformer, the winding halves of which have substantially no leakage reactance. The absence of leakage reactance substantially eliminates distortion due to conduction transfer notch, and the use of an auto-transformer connection permits of direct D.-C. coupling between the load $R_L$ and the collector electrodes 24, 25.

A D.-C. feed-back connection is made between collector electrode 25 of transistor TR4 and emitter electrode 8 of transistor TR1. This loop includes a lead 29 having in series therewith a resistor 30 shunted by a condenser 31. The lead 29 is directly connected to one side of load $R_L$, at which appears an alternating voltage as the transistors TR3 and TR4 transfer current in alternation, and cause current to flow in alternation in windings 26 and 27, in opposite sense.

Reviewing now the operation of the present system, an A.-C. or audio signal, applied between terminals 36 and 38, injects signal current into base 6. On positive half cycles of input signal the emitter-collector resistance of the NPN transistor TR1 is reduced, which causes the base 9 of the transistor TR2 to swing in a negative direction. The transistor TR2 being of PNP type, the negative swing of base 9 is accompanied by a decrease of emitter-collector resistance, which swings the voltage at collector 10 positively with respect to ground. For input signal of opposite polarity an oppositely directed variation of output voltage occurs.

The direct coupled cascaded unit comprising transistors TR1 and TR2 constitute, then, a power amplifier, which provides adequate power to drive the push-pull class B output stage, comprising transistors TR3 and TR4. The input power requirements of an output stage of this type are heavy, since transistors are current operated devices.

In the NPN type transistor operated with common emitter the base must be positive in polarity with respect to the emitter, whereas in the PNP type the base must be negative relative to the emitter. The required polarities are accomplished, utilizing a single positive voltage source, by connecting the base 6 to the lead 4 via a relatively high resistance 12 and connecting the emitter 8 to ground via a relatively low resistance 16. The latter acts to enhance stability by providing a current feed-back loop for transistor TR1. The required polarities for the PNP transistor TR2 are provided by connecting emitter 11 directly to lead 4, while base 9 is connected to collector 7, at the reduced current level associated with transistor TR1.

Push-pull class B transistorized output stages having two transistors of identical conductivity type have been described in the literature. Such amplifiers are generally recognized to be characterized by a distorted output wave, particularly when input signal level is low, and the distortion arises in the form of, or is due to, a conduction transfer notch. It has been found that a conduction transfer notch exists both in respect to input current and output current wave forms, so that elimination of the notch at the input circuit, by any available device, does not result in its elimination at the output circuit of the amplifier.

To eliminate the input notch I employ bi-filarly wound secondary windings of a driver transformer 13. To eliminate the output notch a bi-filarly wound auto-transformer is employed, which further permits direct connection of a load to the collectors of the output transistors, a D.-C. feed-back connection from the load to an input circuit of the amplifier, and minimization of phase shift from collector to load and thence through the feed-back loop. The feed-back loop can include one side of the load only, and the other side may be connected to any desired point of the output auto-transformer for purpose of impedance matching, without affecting the continuity or character of the feed-back loop.

The feedback loop includes a resistance 30, which serves to reduce the voltage applied across the emitter resistance 16. The shunt condenser 31 by-passes the resistance 30 at the higher frequencies, and thereby controls high frequency response.

The value assigned to the condenser 31 is relatively critical, in that the circuit may oscillate for some values of capacitance. In the modification of the present invention which is illustrated in Figure 2 of the accompanying drawings, are included features which prevent such oscillations, the circuits of Figures 1 and 2 being identical except in respect to the latter features.

High frequency oscillations may be obviated by including a damping circuit, consisting of series connected resistance 33, and capacitance 34, between collectors 24 and 25, the values of resistance and capacitance being selected to have high-pass filter characteristics, and representing a low or negligible impedance for the oscillations in question. This expedient is also desirable when the load $R_L$ is constituted of a loud speaker which is highly inductive at frequencies of the order of 100 kilocycles per second.

To eliminate low frequency oscillations, a resistance 35 of the order of 20,000 ohms may be connected between collector 24 and base 6, or by connecting a resistance 32, in series with input capacitor 37, which has a resistance of the order of 2,000 ohms, or both.

While I have described and illustrated one specific embodiment of my invention, it will be clear that variations of the general arrangement and of the details of construction which are specifically illustrated and described may be resorted to without departing from the true spirit and scope of the invention as defined in the appended claims.

What I claim is:

1. A push-pull transistor amplifier, comprising a pair of transistors each of which has a first signal input terminal, a second common terminal and a third terminal, like numbered terminals being alike in operational characteristics and said transistors being of the same conductivity types, a low resistance D.-C. path joining said second common terminals, a signal input transformer having two secondary winding halves connected in push-pull relation to said first signal input terminals, said winding halves being wound in bi-filar relation with one another and having a common terminal connected to said second common terminals via a path of substantially zero impedance, a signal output auto-transformer having two bi-filarly related winding halves, each of said winding halves connected between one of said third terminals and a point of reference potential, and a source of D.-C. bias current connected to said second common terminals.

2. The combination in accordance with claim 1 wherein is further provided a load circuit connected across a portion of one of said last mentioned winding halves connected in series.

3. A push-pull transistor amplifier, comprising a pair of transistors each of which has a first signal input terminal, a second common terminal and a third terminal, like numbered terminals being alike in operational characteristics and said transistors being of the same conductivity types, a low resistance D.-C. path joining said second common terminals, a point of reference potential, a source of D.-C. bias current connected between said second common terminals and said point of reference potential, a signal input transformer having two secondary winding halves connected in push-pull relation to said first signal input terminals, said winding halves being wound in bi-filar relation and having a common terminal connected to said second common terminals, a signal output auto-transformer having two bi-filarly related winding halves, each of said winding halves being connected between one of said third terminals and said point of reference potential, and a load circuit connected across a portion of said last-mentioned winding halves connected in series.

4. A cascade transistor amplifier including a preamplifier stage having a transistor of first conductivity type, a driver stage driven by said preamplifier stage and including a transistor of second conductivity type opposite to said first conductivity type, a push-pull class B power output stage driven by said driver stage and having two push-pull connected transistors of said second conductivity type, each of said transistors including a base, an emitter and a collector, the collector of said first-mentioned transistor being directly connected to the base of said second-mentioned transistor, the bases of said push-pull connected transistors being transformer coupled to the collector of said second-mentioned transistor, said transformer including bi-filarly related secondary windings for providing oppositely phased signal to the bases of said push-pull connected transistors, a point of reference potential, circuit means including a source of D.-C. bias current connected to said point of reference potential for driving each of said transistors in the common emitter configuration, a direct feed-back loop between the collector of one of said push-pull connected transistors and the emitter of the first-mentioned transistor, an output auto-transformer having two bi-filarly related windings respectively connected between the collectors of said push-pull connected transistors and said point of reference potential, and a load connected across at least a portion of said auto-transformer.

5. The combination in accordance with claim 4, wherein is provided a first resistance between the emitter of said first-mentioned transistor and said point of reference potential, and wherein is further provided a second resistance and condenser in parallel in said feed-back loop, said condenser having relatively low impedance at high audio frequencies and an impedance high relative to said second resistance at low audio frequency.

6. A class B transistor amplifier including a pair of transistors each of which has a first signal input terminal, a second common terminal and a third terminal, like-numbered terminals being alike in operational characteristics and said transistors being of the same conductivity types, means joining the second common terminals of said pair by a low resistance D.-C. connection, a point of reference potential, a source of D.-C. bias current connected between said second common terminals and said point of reference potential, a signal input transformer having two secondary winding halves connected in push-pull relation to said first signal input terminals, said winding halves being wound in bi-filar relation.

7. A push-pull transistor amplifier, comprising a pair of transistors each of which has a first signal input terminal, a second common terminal and a third terminal, like numbered terminals being alike in operational characteristics and said transistors being of the same conductivity types, a low resistance D.-C. path joining said second common terminals, a point of reference potential, a source of D.-C. bias current connected between said second common terminals and said point of reference potential, a signal input transformer having two secondary winding halves connected in push-pull relation to said first signal input terminals, said winding halves being wound in bi-filar relation and having a common terminal connected to said second common terminals, a signal output auto-transformer having two bi-filarly related winding halves, each of said auto-transformer winding halves being connected between one of said third terminals and said point of reference potential.

8. A driver circuit for a push-pull transistor power amplifier system, comprising a first NPN transistor having a first base, emitter and collector, a second PNP transistor having a second base, emitter and collector, said second base having a connection only to said first collector, an input capacitor, a pair of signal input terminals one connected to a point of reference potential and the other to said first base via said input capacitor, a D.-C. source having a positive terminal and a negative terminal connected to said point of reference potential, a first resistor connected between said positive terminal and said second emitter, a second resistor connecting said second emitter and said first base, a third resistor connected between said first emitter and said point of reference potential, a filter capacitor connected between said second emitter and said point of reference potential, a transformer including a primary winding connected between said second collector and said point of reference potential and a pair of bi-filarly wound secondary winding halves having respectively adjacent ends, one end of one secondary winding half being connected together with the opposite end of the other secondary winding half to said positive terminal, and the other ends of the respective secondary winding halves thereby providing a pair of push-pull output points for said amplifier system.

9. A power amplifier system comprising the driver circuit of claim 8, and including a first PNP transistor having a third base, emitter and collector, a second PNP transistor having a fourth base, emitter and collector, said third and fourth bases being connected respectively to said output points, said third and fourth emitters being connected to said positive terminal, a signal output auto-transformer having bi-filarly related winding halves connected in series between said third and fourth collectors and being connected at their juncture to said point of reference potential.

10. The combination according to claim 9, including a fourth resistor and third capacitor connected in parallel between said fourth collector and said first emitter, said condenser having relatively low impedance at high audio frequencies and an impedance high relative to said fourth resistor at low audio frequency.

11. A cascade transistor amplifier including a preamplifier stage having a transistor of first conductivity type, a driver stage driven by said preamplifier stage and including a transistor of second conductivity type opposite to said first conductivity type, a push-pull class B power output stage driven by said driver stage having two push-pull connected transistors of said second conductivity type, each of said transistors including a base, an emitter and a collector, means driving each of said transistors in the common emitter configuration, and a direct feed-back loop between the collector of one of said push-pull connected transistors and the emitter of the first-mentioned transistor, wherein the base of said second mentioned transistor is directly connected to the collector of said first mentioned transistor, said last mentioned collector being connected directly only to said last mentioned base, wherein the bases of said push-pull connected transistors are transformer coupled to the collector of said second mentioned transistor, and wherein said transformer includes bi-filarly related secondary windings for providing oppositely phased signal to the bases of said push-pull connected transistors, and a single primary winding connected between said collector of said driver stage and a point of reference potential.

12. A cascade transistor amplifier including a preamplifier stage having a transistor of first conductivity type, a driver stage driven by said preamplifier stage and including a transistor of second conductivity type opposite to said first conductivity type, a push-pull class B power output stage driven by said driver stage having two push-pull connected transistors of said second conductivity type, each of said transistors including a base, an emitter and a collector, means driving each of said transistors in the common emitter configuration, and a direct feed-back loop between the collector of one of said push-pull connected transistors and the emitter of the first-mentioned transistor, wherein the base of said second mentioned transistor is directly connected to the collector of said first mentioned transistor, said last mentioned collector being connected directly only to said last mentioned base, wherein the bases of said push-pull connected transistors are transformer coupled to the collector of said second mentioned transistor, and wherein said transformer includes bifilarly related secondary windings for providing oppositely phased signal to the bases of said push-pull connected transistors, and a single primary winding connected between said collector of said driver stage and a point of reference potential, wherein is further provided a load, an output auto-transformer for said push-pull connected transistors, said auto-transformer having two bifilarly related windings, each of said windings connected between a different one of the collectors of said push-pull connected transistors and a point of reference potential, said load being connected across at least a portion of said auto-transformer.

13. A cascade transistor amplifier including a preamplifier stage having a transistor of first conductivity type, a driver stage driven by said preamplifier stage and including a transistor of second conductivity type opposite to said first conductivity type, a push-pull class B power output stage driven by said driver stage having two push-pull connected transistors of said second conductivity type, each of said transistors including a base, an emitter and a collector, means driving each of said transistors in the common emitter configuration, and a direct feed-back loop between the collector of one of said push-pull connected transistors and the emitter of the first-mentioned transistor, wherein the base of said second mentioned transistor is directly connected to the collector of said first mentioned transistor, said last mentioned collector being connected directly only to said last mentioned base, wherein the bases of said push-pull connected transistors are transformer coupled to the collector of said second mentioned transistor, and wherein said transformer includes bifilarly related secondary windings for providing oppositely phased signal to the bases of said push-pull connected transistors, and a single primary winding connected between said collector of said driver stage and a point of reference potential, wherein is further provided a first resistance between the emitter of said first mentioned transistor and said point of reference potential, and wherein is further provided a second resistance and condenser in parallel in said feedback loop, said condenser having relatively low impedance at high audio frequencies and an impedance high relative to said second resistance at low audio frequency.

References Cited in the file of this patent

UNITED STATES PATENTS

| | | |
|---|---|---|
| 1,779,881 | Jones | Oct. 28, 1930 |
| 2,361,198 | Harmon | Oct. 24, 1944 |
| 2,529,459 | Pourciau et al. | Nov. 7, 1950 |
| 2,545,788 | McIntosh | Mar. 20, 1951 |
| 2,691,074 | Eberhard | Oct. 5, 1954 |
| 2,791,645 | Bessey | May 7, 1957 |

FOREIGN PATENTS

| | | |
|---|---|---|
| 1,089,681 | France | Mar. 21, 1955 |

OTHER REFERENCES

Shea: "Principles of Transistor Circuits," pages 121 and 153, September 15, 1953.

Hafler: "Ultralinear Operation of 6V6 Tubes," Radio and Television News, June 1954, pages 43–45, 117.

Freedman et al.: "An Experimental, etc.," Proc. I.R.E., June 1955, pages 671–678.

Holmes et al.: "A Developmental, etc.," Proc. I.R.E., June 1955, pages 662–670.

Shea text, of record, additional pages 349–351.